(12) United States Patent
Yan et al.

(10) Patent No.: US 10,914,583 B2
(45) Date of Patent: Feb. 9, 2021

(54) SENSE AMPLIFIERS FOR GYROSCOPES AND RELATED SYSTEMS AND METHODS

(71) Applicant: Analog Devices, Inc., Norwood, MA (US)

(72) Inventors: Jiefeng Yan, Andover, MA (US); William A. Clark, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 15/900,622

(22) Filed: Feb. 20, 2018

(65) Prior Publication Data
US 2019/0257654 A1    Aug. 22, 2019

(51) Int. Cl.
*G01C 19/5712* (2012.01)
*G01C 19/5776* (2012.01)
*B81B 7/00* (2006.01)

(52) U.S. Cl.
CPC .......... *G01C 19/5712* (2013.01); *B81B 7/008* (2013.01); *G01C 19/5776* (2013.01); *B81B 2201/0242* (2013.01)

(58) Field of Classification Search
CPC ............ G01C 19/5712; G01C 19/5776; G01C 19/5614; G01C 19/5607; G01C 19/5649
See application file for complete search history.

(56) References Cited

U.S. PATENT DOCUMENTS 4,569,072 A * 2/1986 van Roermund .... H03H 19/004
                                                    327/556
6,078,275 A * 6/2000 Borgen ................. G06F 1/0342
                                                    341/144
(Continued)

FOREIGN PATENT DOCUMENTS

CN    104539257 A    4/2015
CN    104567850 A    4/2015
(Continued)

OTHER PUBLICATIONS

Crescentini et al., Noise Limits of CMOS Current Interfaces for Biosensors: A Review. IEEE Transactions on Biomedical Circuits and Systems. Apr. 2014;8(2):278-92.

*Primary Examiner* — Helen C Kwok
(74) *Attorney, Agent, or Firm* — Wolf, Greenfield & Sacks, P.C.

(57) ABSTRACT

Sense amplifiers for use in connection with microelectromechanical system (MEMS) gyroscopes are described. The sense amplifiers may be configured to change the level of a gyroscope signal, i.e., the signal produced by a gyroscope in response to angular motion, to a level suitable for processing circuitry arranged to infer the angular velocity. The sense amplifier may further provide a DC discharge path allowing for discharge of the DC component of the output signal. The DC discharge path may include an anti-aliasing filter and a resistive circuit. The anti-aliasing filter may filter the output signal to maintain the resistive circuit in the linear region. The anti-aliasing filter may be designed with a frequency response such that discrete frequency sub-bands are blocked or at least attenuated. The frequency sub-bands may be tuned to substantially match the gyroscope's resonant frequency and its integer multiples.

20 Claims, 11 Drawing Sheets

(56) References Cited

U.S. PATENT DOCUMENTS

| | | |
|---|---|---|
| 8,754,699 B2 | 6/2014 | Bawa et al. |
| 9,644,961 B2 | 5/2017 | Aaltonen |
| 2008/0111625 A1* | 5/2008 | Fukuzawa .......... G01C 19/5607 330/254 |
| 2012/0041695 A1* | 2/2012 | Baldwin ................ G01H 1/003 702/56 |
| 2014/0305185 A1* | 10/2014 | Maki ................... H03M 1/0629 73/1.37 |
| 2016/0077126 A1* | 3/2016 | Jeong ................... G01P 15/125 702/104 |
| 2018/0184923 A1* | 7/2018 | Tal ......................... A61B 5/742 |
| 2019/0103880 A1* | 4/2019 | Chen ....................... H03M 5/02 |
| 2019/0126936 A1* | 5/2019 | Murashima ....... B60W 50/0205 |

FOREIGN PATENT DOCUMENTS

| | | |
|---|---|---|
| EP | 2259426 A1 | 12/2010 |
| JP | 59112718 A2 | 6/1984 |
| JP | 4299607 A2 | 10/1992 |
| JP | 2002185298 A | 6/2002 |
| JP | 2012049599 A | 3/2012 |

\* cited by examiner

SENSE AMPLIFIERS FOR GYROSCOPES AND RELATED SYSTEMS AND METHODS

FIELD OF THE DISCLOSURE

The present application relates to microelectromechanical system (MEMS) gyroscopes.

BACKGROUND

MEMS gyroscopes detect angular motion by sensing accelerations produced by Coriolis forces. Coriolis forces arise when a resonant mass of a MEMS gyroscope is subjected to angular motion.

SUMMARY OF THE DISCLOSURE

Some embodiments are directed to a sense amplifier for use in connection with MEMS gyroscopes. A sense amplifier may be configured to change the level of a gyroscope signal, the signal produced by a gyroscope in response to angular motion, to a level suitable for processing circuitry arranged to infer the angular velocity. The sense amplifier may further provide a DC discharge path allowing for discharge of the DC component of the output signal. The DC discharge path may include an anti-aliasing filter and a resistive circuit. The anti-aliasing filter may filter the output signal to maintain the resistive circuit in the linear region. The anti-aliasing filter may be designed with a frequency response such that discrete frequency sub-bands are blocked or at least attenuated. The frequency sub-bands may be tuned to substantially match the gyroscope's resonant frequency and its integer multiples.

Some embodiments are directed to a MEMS apparatus comprising a gyroscope and a sense amplifier. The sense amplifier may comprise an operational amplifier having an input terminal coupled to the gyroscope and an output terminal, and a feedback circuit coupled between the input terminal and the output terminal of the operational amplifier, the feedback circuit comprising an anti-aliasing filter and a resistive circuit.

Some embodiments are directed to a method for sensing angular motion using a MEMS gyroscope. The method may comprise, in response to angular motion of the MEMS gyroscope, generating a gyroscope signal representative of a rate of the angular motion, wherein the gyroscope has a resonant frequency, providing the gyroscope signal to an input terminal of an operational amplifier, generating an output signal based on the gyroscope signal by using a feedback circuit coupled between the input terminal of the operational amplifier and an output terminal of the operational amplifier to, and attenuating the output signal at the resonant frequency by using a filter coupled between the input terminal of the operational amplifier and the output terminal of the operational amplifier.

Some embodiments are directed to a MEMS apparatus. The MEMS apparatus may comprise a gyroscope, an operational amplifier having an input terminal coupled to the gyroscope and an output terminal, a first feedback circuit coupled between the input terminal and the output terminal of the operational amplifier, the first feedback circuit exhibiting a low-pass frequency response, and a second feedback circuit coupled in parallel to the first feedback circuit, the second feedback circuit exhibiting a high-pass frequency response.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

I. Overview

The inventors have recognized and appreciated that the accuracy with which angular motion is detected using gyroscopes is often too poor to meet the demands of applications in which high sensitivity is important. Detection of angular motion in automotive applications, for example, often calls for sensitivities such that angular rates of as low as a few millidegrees per second or less can be detected. The inventors have further recognized and appreciated that the limiting factor in providing sufficiently accurate measures of angular rate is often attributable to the scarce performance of the sense amplifiers that are used to boost the gyroscope signals. Sense amplifiers are commonly used in connection with gyroscopes to boost the signals generated by the gyroscopes in response to angular motion. Unfortunately, conventional sense amplifiers suffer from poor noise rejection capabilities and/or non-linear responses. Non-linearity and noise critically impair the circuit's ability to accurately detect angular motion, especially when the rate with which the angular motion occurs is low.

In particular, the inventors have recognized and appreciated that the poor noise rejection and linearity characteristics in a sense amplifier arise in the sense amplifier's direct current (DC) discharge path. DC discharge paths are used to limit the DC signals biasing a sense amplifier to ensure that the sense amplifier operate in the linear region—i.e., to prevent saturation of the sense amplifier. Some sense amplifiers use resistors as the discharge path. To enhance the resistors' ability to discharge the DC signals, high-resistance resistors (e.g., 1 GΩ) are typically used. Unfortunately, such large resistances enhance thermal noise and occupy large areas on the chip. Other sense amplifiers replace these large resistors with transistors. Compared to resistors, however, transistors have very limited ranges in which they operate linearly. As a result, these discharge paths introduce non-linearities in the sense amplifier.

Recognizing these limitations, the inventors have developed high-sensitivity sense amplifiers for gyroscopes in which noise rejection capabilities and linearity characteristics are improved relative to prior implementations. The sense amplifiers developed by the inventors utilize filters in the discharge path adapted to attenuate alternate current (AC) signals in the discharge path while still providing a discharge path to the DC signals.

Some embodiments of the present disclosure are directed to sense amplifiers using low-pass filters arranged to promote linearity in the discharge path by attenuating AC signal components relative to the DC signal component. In particular, these low-pass filters may be designed with cut-off frequencies (e.g., 3 dB frequencies) that are lower than the resonant frequency $f_S$ of the gyroscope to which the sense amplifier is connected. In this way, the AC components of the signal generated by the gyroscope in response to angular motion are attenuated to levels (e.g., amplitudes) sufficiently low to prevent the discharge circuits to depart from the linear region of operation. These filters are referred to herein as continuous-spectrum low-pass filters.

Other embodiments of the present disclosure are directed to sense amplifiers using anti-aliasing filters (AAF) in the discharge path. AAFs of the types described herein are configured to attenuate (e.g., reduce the amplitude of) signals oscillating at specific frequencies. For example, an AAF may be configured to attenuate signals oscillating approximately at the resonant frequency $f_S$ of the gyroscope to which it is connected, or to attenuate signals oscillating approximately at $nf_S$, where n=1, 2, 3 . . . . In some embodiments, AAFs of the types described herein are configured to attenuate only the resonant frequency $f_S$, or only the resonant frequency $f_S$ and its integer multiples. That is, the AAF is configured to attenuate discrete frequencies only, or only discrete sub-bands. These types of AAFs effectively operate as low-pass filters in that they attenuate AC signal components relative to the DC signal component. These filters are referred to herein as low-pass comb filters.

Whether through continuous-spectrum low-pass filters or through low-pass comb filters (such as AAFs), the sense amplifiers developed by the inventors provide discharge paths with high noise rejection capabilities and highly linear characteristics.

II. Examples of Mems Gyroscopes

Figure 1A:
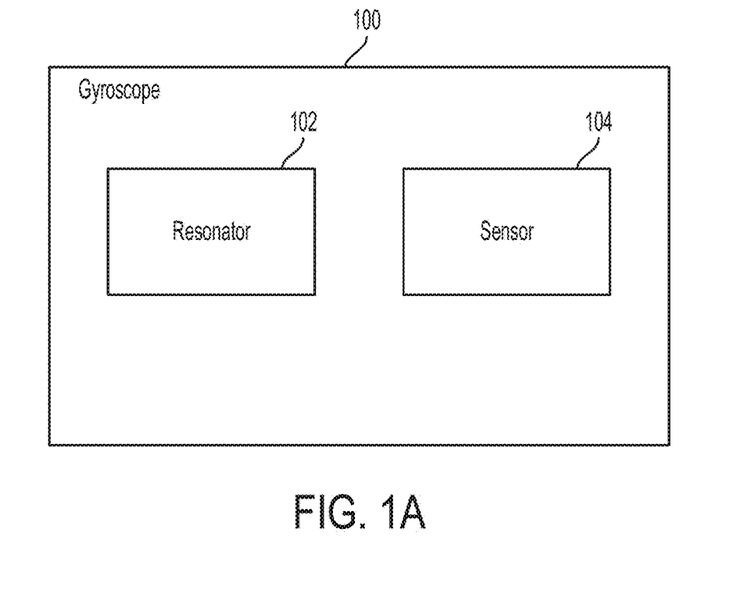
FIG. 1A is a block diagram illustrating a MEMS gyroscope, in accordance with some embodiments of the technology described herein.

FIG. 1 is a block diagram illustrating a gyroscope 100, in accordance with some embodiments. Gyroscope 100 comprises resonator 102 and sensor 104. Resonator 102 is configured to resonate periodically, when driven by a periodic drive signal. Sensor 104 (which may be an accelerometer in some embodiments) is configured to sense angular velocities. Accordingly, when gyroscope 100 is subjected to angular motion (e.g., when the gyroscope is rotated relative to an axis), the angular rate at which the angular motion occurs (e.g., the rate of rotation) can be sensed using sensor 104.

In some embodiments, gyroscope 100 is configured to sense angular velocities by detecting acceleration arising from the Coriolis effect. The Coriolis effect, and hence a Coriolis force, arises when: 1) resonator 102 resonates; and 2) the gyroscope is subjected to angular motion. In these circumstances, sensor 104 may detect the acceleration resulting from the Coriolis effect. The angular rate associated with the angular motion may be inferred from the acceleration, for example, by using sense circuitry (not shown in FIG. 1A) coupled to sensor 104.

Figure 1B:
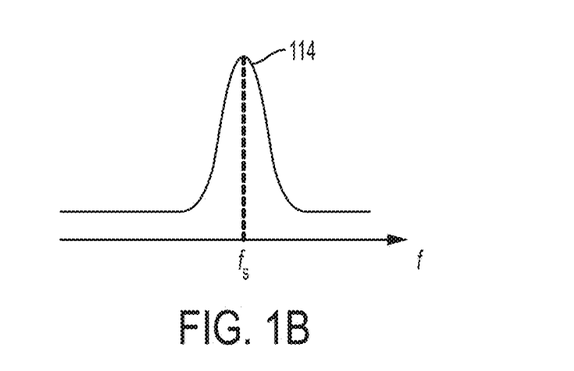
FIG. 1B is a plot illustrating an example of a frequency response of a MEMS gyroscope, in accordance with some embodiments of the technology described herein.

In some embodiments, the frequency response of gyroscope 100 depends at least in part on the physical characteristics (e.g., the geometry or the material or materials with which the sensor is made) of resonator 102 and/or sensor 104. In some embodiments, gyroscope 100 may have a frequency response that exhibits a resonance, and consequently the spectrum of the gyroscope's response may have a (local or global) peak at the resonance. FIG. 1B is a plot illustrating an example of a frequency response of gyroscope 100, in accordance with some embodiments. As illustrated, frequency response 114 exhibits a peak at resonant frequency $f_S$. Having a resonant response, the magnitude of the response to angular motion can be enhanced by matching the frequency of the drive signal to the peak frequency of the gyroscope.

Resonator 102 and sensor 104 may be arranged in any suitable way. In some embodiments, resonator 102 includes a mass and sensor 104 include a separate mass. In other embodiments, resonator 102 and sensor 104 share the same mass.

Figure 2:
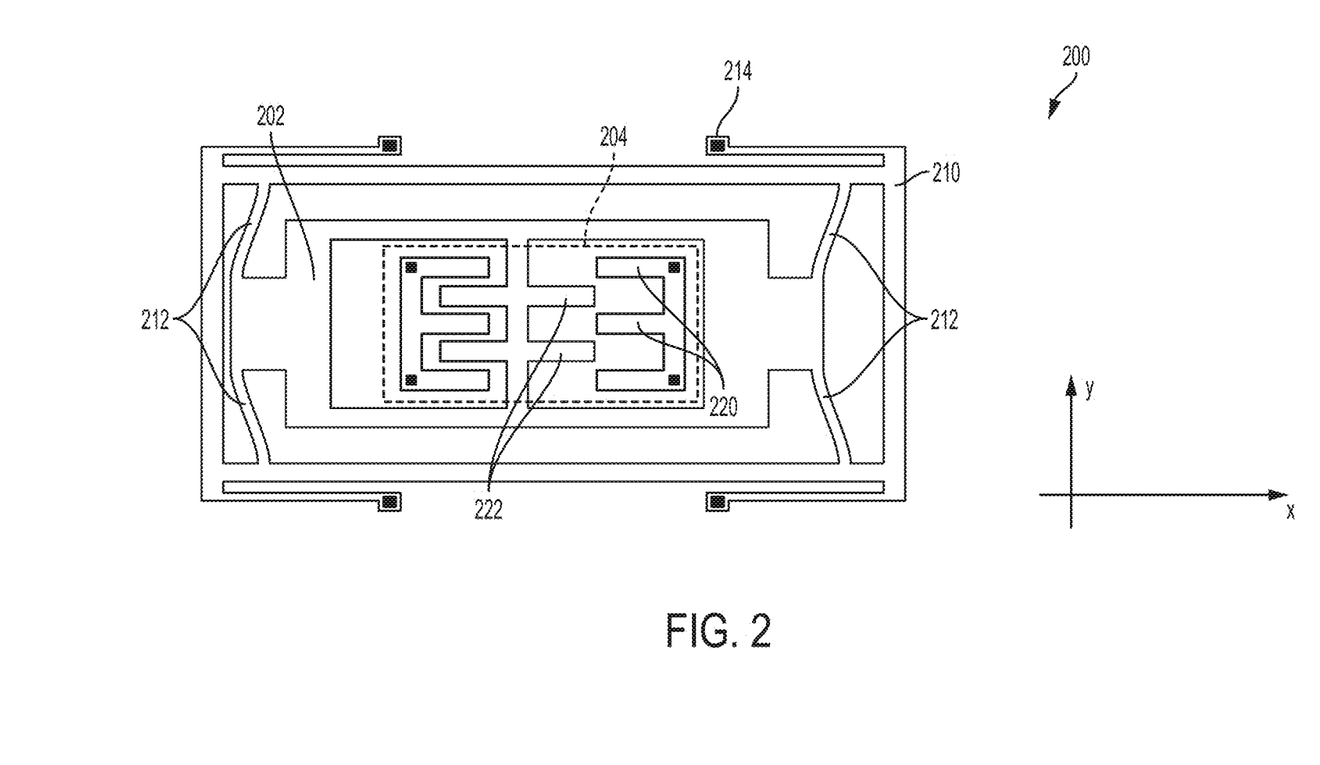
FIG. 2 is a schematic illustration of an example MEMS gyroscope, in accordance with some embodiments of the technology described herein.

One example implementation of gyroscope 100 is illustrated in FIG. 2, in accordance with some embodiments. In this example, gyroscope 200 is configured to resonate in a direction parallel to the x-axis and to detect Coriolis forces in a direction parallel to the y-axis. It should be appreciated, however, that gyroscopes of the types described herein are not limited to any specific direction of resonance or detection. Gyroscope 200 includes a stationary frame 210 (anchored to an underlying substrate via anchors 214), proof mass 202, and fixed electrodes 220. Proof mass 202 is elastically coupled to stationary frame 210 via couplers 212. Couplers 212 may be elastic, thus allowing for motion of proof mass 202 relative to stationary frame 210. In this example, proof mass 202 serves as resonator 102. Accordingly, when a drive signal is applied to one or more electrodes (not shown in FIG. 2) coupled to proof mass 202, proof mass 202 oscillates back and forth along the x-axis, where the periodicity of the oscillation is determine by (e.g., is equal to) the frequency of the drive signal.

Proof mass 202 includes a plurality of free-end beams 222, which form a plurality of sense capacitors with respective fixed electrodes 220. The sense capacitors may sense motion of the proof mass along the y-axis, such that the capacitance of the sense capacitors depends on the acceleration of the proof mass. Accordingly, free-end beams 222 and fixed electrodes 220 collectively form sensor 204, which may serve as sensor 104.

When gyroscope 200 is subjected to angular motion about the x-axis and proof mass 202 is driven to oscillate along the x-axis, a Coriolis force along the y-axis arises and the proof mass moves along the y-axis. By detecting the acceleration of proof mass 202 along the y-axis, using sensor 204, the angular velocity can be inferred.

The signal generated in response to angular motion of the gyroscope using the sensor 104 (sensor 204 in the example of FIG. 2) is referred to herein as the "gyroscope signal." In at least some of the embodiments in which sensor 104 includes capacitive sensors (such as the capacitors formed by free-end beams 222 and fixed electrodes 220), the gyroscope signals are electric currents. In these embodiments, in fact, when a variation in the capacitance of the capacitor arises due to a change in the separation between its electrodes, an electric current may result that varies according to the variation in the capacitance.

III. Sense Amplifiers

To infer the angular rate from a gyroscope signal, further processing of the gyroscope signal is often needed. The processing may be performed in the analog and/or the digital domain, and may involve various operations, including analog-to-digital conversion. Unfortunately, gyroscopes signals are often too weak in amplitude for the processing circuits. Certain analog-to-digital converters (ADCs), for example, may require input voltages above a certain value, otherwise they would mostly sample noise. To adapt the level of the gyroscope signals to levels suitable for processing, sense amplifiers are used in some embodiments.

Figure 3A:
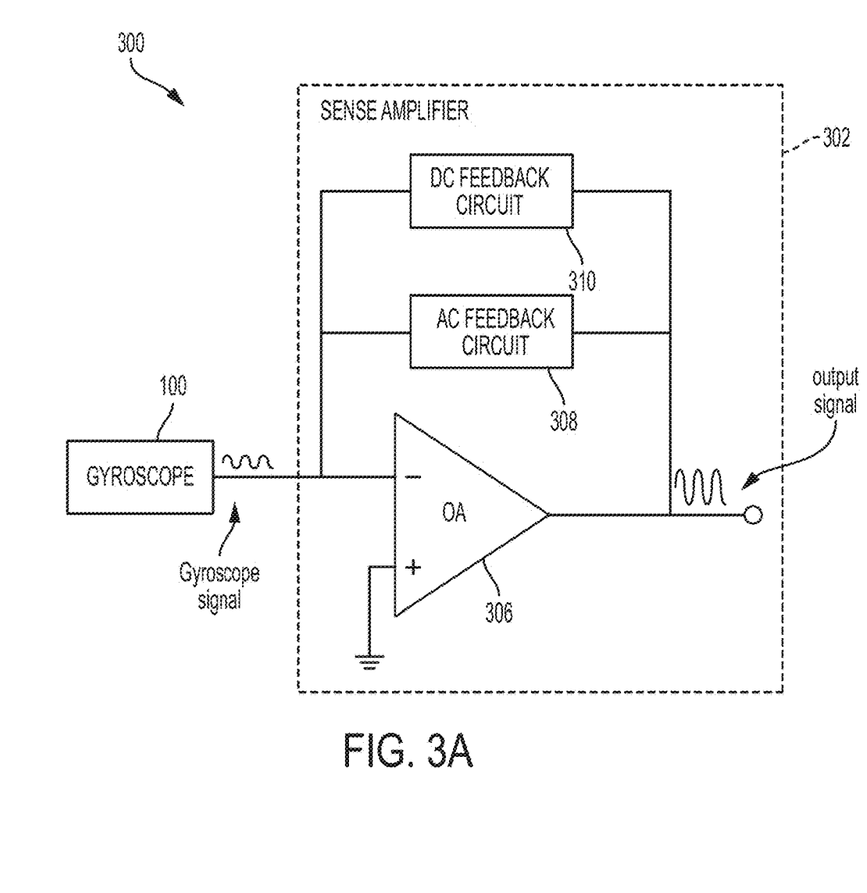
FIG. 3A is a block diagram of an example MEMS apparatus comprising a gyroscope and a sense amplifier, in accordance with some embodiments of the technology described herein.
Figure 3B:
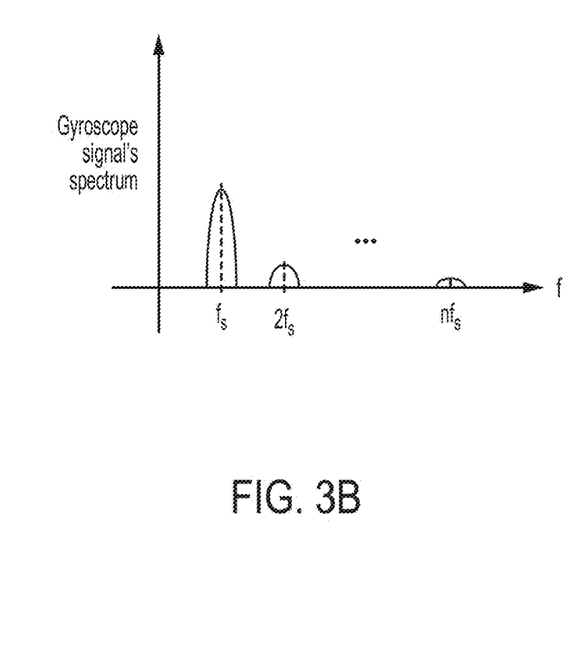
FIG. 3B is a plot illustrating an example of a gyroscope signal spectrum, in accordance with some embodiments of the technology described herein.

FIG. 3A is a block diagram illustrating a MEMS apparatus 300 including gyroscope 100 and a sense amplifier 302, in accordance with some embodiments. Gyroscope 100 may be configured to detect angular motion about one, two or three axes, and may be implemented in any suitable way, including as shown in FIG. 2. Sense amplifier 302 includes operational amplifier (OA) 306, AC feedback circuit 308 and DC feedback circuit 310. Responsive to angular motion, gyroscope 100 may output a gyroscope signal. In some embodiments, the gyroscope signal may be modulated around resonant frequency $f_S$ (e.g., may be modulated with a carrier frequency equal to, or substantially equal to, $f_S$). FIG. 3B is a plot illustrating an example spectrum of a gyroscope signal, in accordance with some embodiments. In this example, the amplitude of the gyroscope signal at the resonant frequency $f_S$ is substantially greater than it is at the integer multiples of $f_S$. It should be appreciated, however, that not all embodiments are limited in this respect as the amplitude of the gyroscope signal at the integer multiples of $f_S$ may be larger than shown in FIG. 3B. The relative amplitude of the gyroscope signal's harmonics may depend on various parameters, including for example the rate of angular motion, the spectrum of the signal driving resonator 102, or the geometry of the gyroscope 100.

Referring back to FIG. 3A, OA 306 may be implemented in any suitable way. OA 306 may have an open-loop voltage-to-voltage gain ($A_V$) that is greater than 0 dB, greater than 10 dB, greater than 20 dB, greater than 30 dB, greater than 40 dB, greater than 50 dB, or greater than any other suitable value. OA 306 may include metal-oxide-semiconductor (MOS) transistors or any other suitable types of transistors. OA 306 may have a differential (as shown in FIG. 3A) or single-ended input stage, and a differential or single-ended (as shown in FIG. 3A) output stage. The OA's "+" input terminal may be connected to a reference potential (e.g., ground), as shown in the figure, directly or via other circuit components. The DC feedback circuit 310 and the AC feedback circuit 308 may be coupled between an output terminal of the OA 306 and an input terminal (such as the "−" input terminal). When coupled to the "−" input terminal, the DC feedback circuit 310 and the AC feedback circuit 308 provide a negative feedback.

The signal present at the output terminal is referred to herein as the output signal. The output signal may reflect variations in the gyroscope signal, but with a level that is suitable for the following processing circuits. In the embodiments in which the gyroscope signal is an electric current, sense amplifier 302 may serve as a current-to-voltage converter, with the output signal being a voltage. In some embodiments, the sense amplifier 302 exhibits a transconductance gain ($g_M$) that is between 1 k$\Omega^{-1}$ and 100 G$\Omega^{-1}$, between 10 G$\Omega^{-1}$ and 100 G$\Omega^{-1}$, between 100 G$\Omega^{-1}$ and 100 G$\Omega^{-1}$, between 1M$\Omega^{-1}$ and 100 G$\Omega^{-1}$, between 10M$\Omega^{-1}$ and 100 G$\Omega^{-1}$, between 100M$\Omega^{-1}$ and 100 G$\Omega^{-1}$, between 1 G$\Omega^{-1}$ and 100 G$\Omega^{-1}$ or between 10 G$\Omega^{-1}$ and 100 G$\Omega^{-1}$.

AC feedback circuit 308 may be arranged to provide the desired input-output transfer characteristic. For example, in the embodiments in which the desired characteristic is such that a current-to-voltage conversion is provided, or in other circumstances, AC feedback circuit 308 may be adapted to provide a high-pass path from OA 306's output terminal to OA 306's input terminal. As such, AC feedback circuit 308 may exhibit a high-pass frequency response. To achieve the desired high-pass frequency response, AC feedback circuit 308 may be arranged to block the DC component. In one example, AC feedback circuit 308 may be implemented with a reactive circuit (i.e., a circuit having a non-zero reactance). The reactive circuit may include one or more capacitors in some embodiments.

DC feedback circuit 310 may be configured to provide a discharge path to the DC component (and/or other low frequency components) of the output signal between the output and an input terminal of OA 306. Discharging the DC component (and/or other low frequency components) in this manner may reduce the likelihood that OA 306 reaches saturation. To allow passage of the DC component (and/or other low frequency components), DC feedback circuit 310 may be arranged to provide a low-pass frequency characteristic.

Figure 3C:
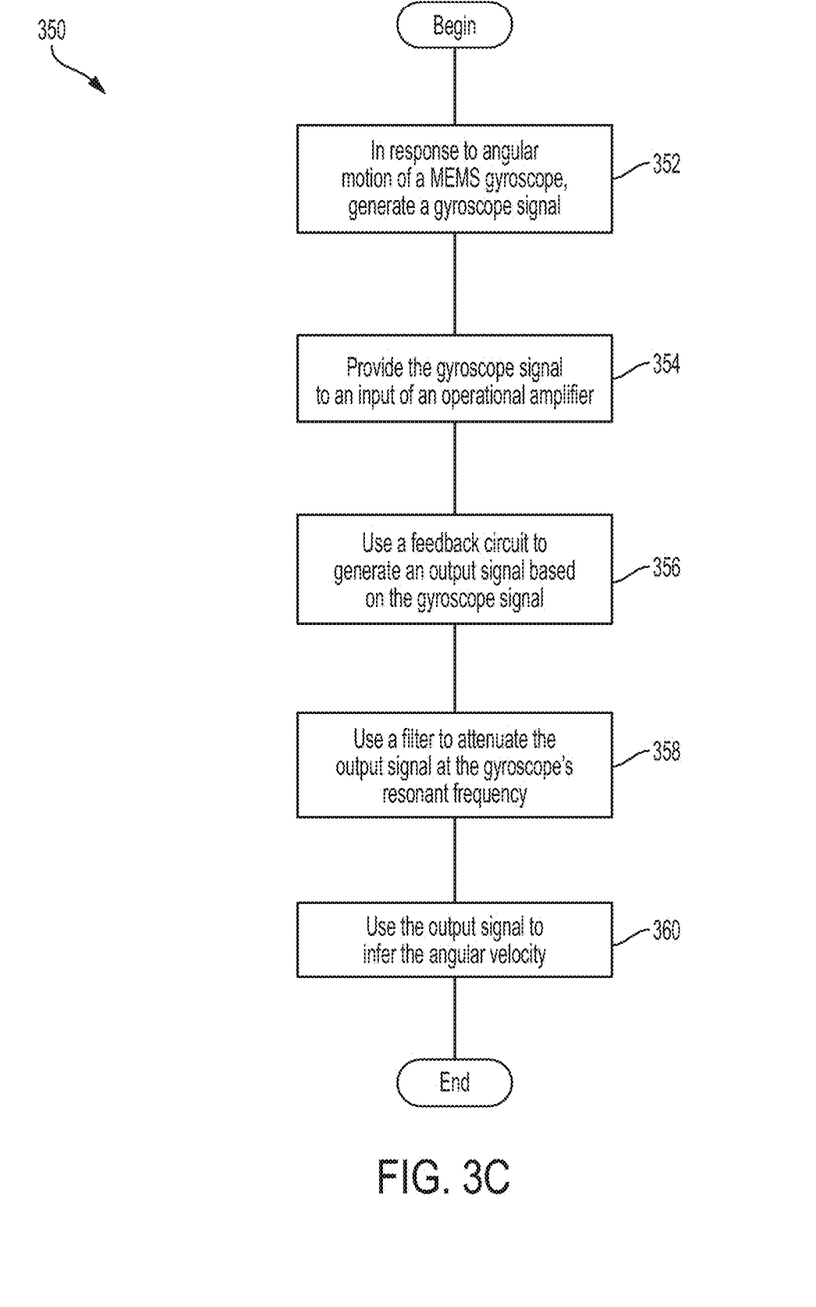
FIG. 3C is a flowchart illustrating an example of a method for sensing angular motion using a MEMS gyroscope, in accordance with some embodiments of the technology described herein.

FIG. 3C is a flowchart illustrating an example of a method for sensing angular motion using a MEMS gyroscope having a frequency response exhibiting a resonant frequency, in accordance with some embodiments. Method 350 begins at act 352, in which, in response to angular motion of the MEMS gyroscope, a gyroscope signal representative of a rate of the angular motion is generated. The gyroscope signal may be an electric current in some embodiments, for example if the gyroscope's sensor is of the capacitive type.

At act 354, the gyroscope signal may be provided to an input of an operational amplifier coupled to the gyroscope.

At act 356, a feedback circuit coupled between the input terminal of the operational amplifier and an output terminal of the operational amplifier may be used to generate an output signal based on the gyroscope signal. For example, the feedback circuit may be arranged such that the operational amplifier and the feedback circuit collectively provide a current-to-voltage conversion. In such a circumstance, the output signal is a voltage.

At act 358 a filter coupled between the input terminal of the operational amplifier and the output terminal of the operational amplifier may be used to discharge the DC component (and/or other low-frequency components) of the output signal, thereby preventing or otherwise reducing the likelihood of saturation of the operational amplifier. In some embodiments, the filter may attenuate the output signal substantially at the resonant frequency of the gyroscope and, optionally, at integer multiples of the resonant frequency. In some embodiments, the filter may attenuate the output signal only at the resonant frequency (and optionally only at integer multiples of the resonant frequency), or only at frequency sub-bands at the resonant frequency and its integer multiples.

At act 360, the output signal may be used to infer the rate of the angular motion (the angular velocity). Processing circuitry coupled to the output of the operational amplifier may be used for that purpose.

Figure 4A:
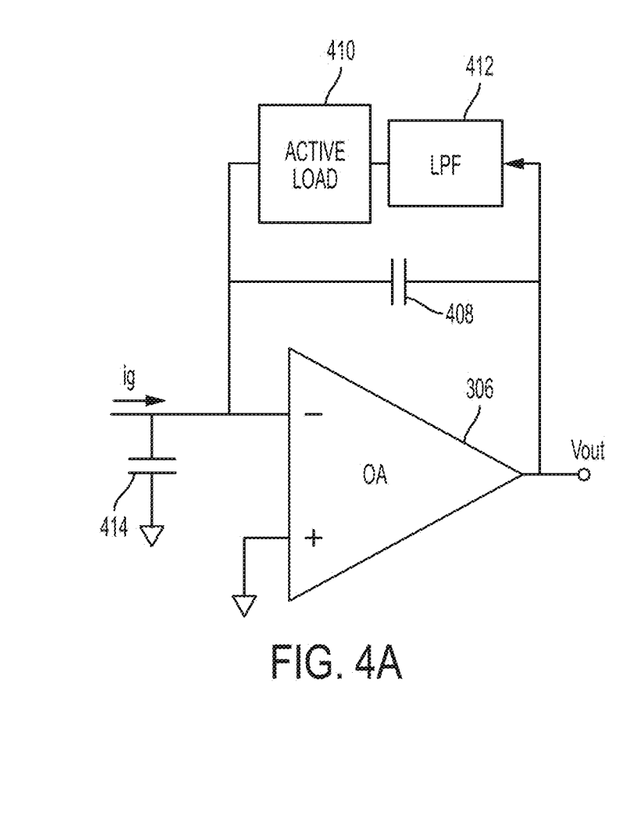
FIG. 4A is a block diagram illustrating a possible implementation for the sense amplifier of FIG. 3A that includes a low-pass filter, in accordance with some embodiments of the technology described herein.

In some embodiments, DC feedback circuit 310 is implemented using a continuous-spectrum low pass filter. One such implementation is depicted in FIG. 4A, in accordance with some embodiments. In the example of FIG. 4A, capacitor 408 serves as the AC feedback circuit 308 and active load 410 and low-pass filter (LPF) 412 collective serve as DC feedback circuit 310. In this case, the gyroscope signal is an electric current (labeled "$i_g$") and a capacitor 414 is placed at the input terminal "−" of the OA 306. Capacitors 414 and 408, and OA 306 may be collectively configured to convert $i_g$ into a voltage at the output terminal ("$V_{out}$"). Being a capacitor, capacitor 408 is configured to block the DC component (and optionally other low frequency components) thus providing a high-pass frequency response.

Figure 4B:
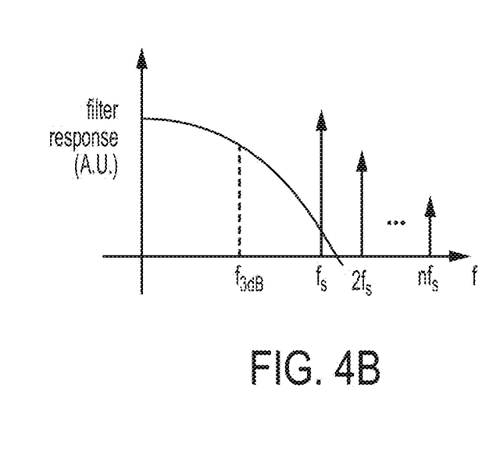
FIG. 4B is a plot illustrating an example frequency response of the low-pass filter of FIG. 4A, in accordance with some embodiments of the technology described herein.

Active load 410 and LPF 412 may be configured to allow passage of the DC component of $V_{out}$, thus allowing the DC component to be discharged to ground. Active load 410 may include one or more active circuit components, such as one or more transistors, configured as a resistive circuit (i.e., as a circuit providing a substantially resistive response). The active circuit may be used in lieu of actual resistors to limit chip space usage and noise. LPF 412 may filter the output signal to a degree so that the active components of active load 410 operate substantially in the linear region. In some embodiments, as illustrated in FIG. 4B, LPF 412 may exhibit a continuous low-pass response in which the cutoff frequency (e.g., the 3 dB frequency $f_{3dB}$) of the filter is less than the resonant frequency $f_S$. In this way, the AC components of the output signal are blocked, while the DC component can pass through. As a result, active load 410 provides a DC discharge path while remaining in the linear region.

This implementation may be practical in circumstances in which the resonant frequency $f_S$ is at least 1 MHz. Resonant frequencies in the kilohertz range, however, would lead to a reduction in the filter's cutoff frequency, which would render the design of the filter more challenging. To obviate this challenge, the inventors have developed DC feedback circuits including AAFs configured to attenuate specific discrete frequencies or frequency sub-bands. The frequencies attenuated by the AAFs may be tuned to substantially match the gyroscope's resonant frequency and its integer multiples. As a result, AAFs of these types allow passage of the DC component while blocking the AC components at $nF_S$, where n=1, 2, 3 . . . . In this respect, AAFs of the types describes herein are also referred to as low-pass comb filters.

Figure 5A:
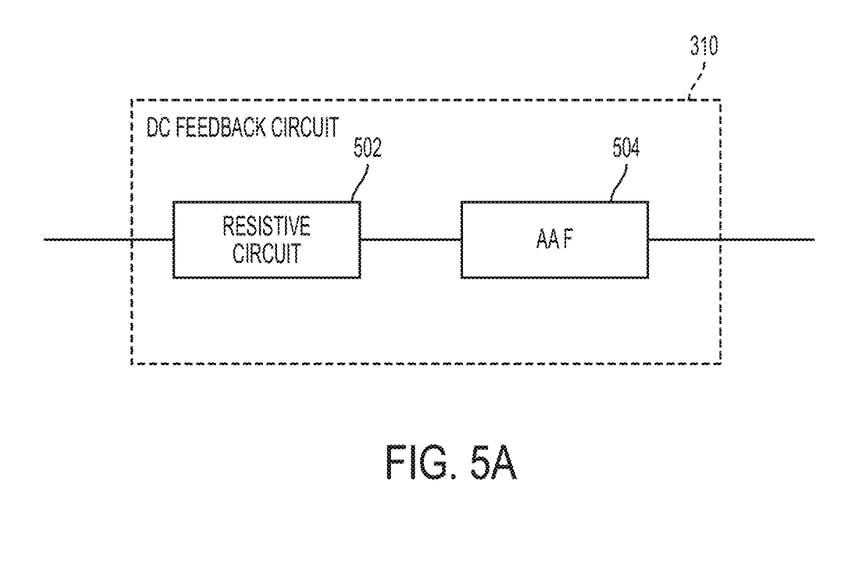
FIG. 5A is a block diagram illustrating another possible implementation for the sense amplifier of FIG. 3A that includes an anti-aliasing filter, in accordance with some embodiments of the technology described herein.
Figure 5B:
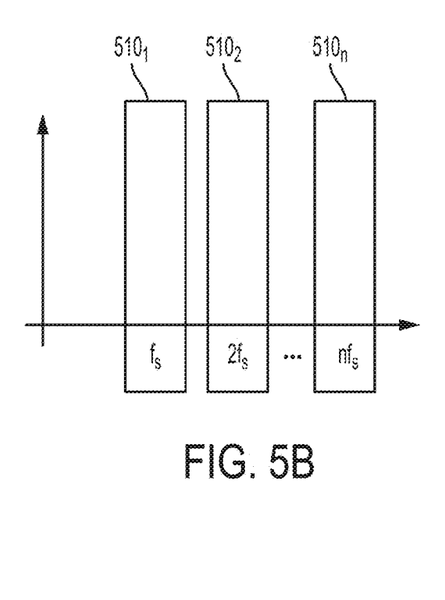
FIG. 5B is a plot illustrating a plurality of block sub-bands that may arise when using the anti-aliasing filter of FIG. 5A, in accordance with some embodiments of the technology described herein.
Figure 5C:
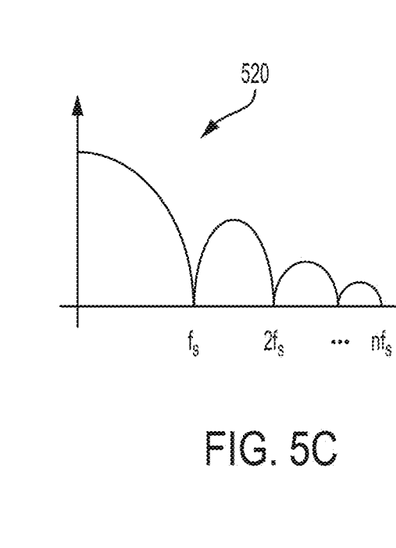
FIG. 5C is a plot illustrating an example of a frequency response of the anti-aliasing filter of FIG. 5A, in accordance with some embodiments of the technology described herein.

FIG. 5 is a block diagram illustrating a DC feedback circuit 310 having a resistive circuit 502 and an anti-aliasing filter 504. Resistive circuit 502 may be implemented as described in connection with active load 410, though actual resistors may additionally or alternatively be used. FIG. 5B is a plot illustrating a possible spectral characteristic of AAF 504, in accordance with some embodiments. In this example, AAF 504 is configured as a comb filter. As shown, AAF 504 may block or at least attenuate (e.g., by more than 20 dB) discrete frequency sub-bands $510_1$, $510_2$ . . . $510_n$, where sub-band $510_1$ overlaps with $f_S$, sub-band $510_2$ overlaps with $2f_S$ and sub-band $510_n$ overlaps with $nf_S$. The frequency bands outside these sub-bands, including the DC component, may be allowed to pass through AAF 504 with relatively low attenuation (e.g., less than 3 dB). One specific example of a frequency response that AAF 504 may implemented to exhibit is illustrated in the plot of FIG. 5C. In particular, FIG. 5C is a plot illustrating an example of an amplitude frequency response, in accordance with some embodiments. As shown, frequency response 520 exhibits a plurality of zeros occurring at frequencies $nf_S$. In this way, a signal passing through AAF 504 and having spectral components at frequencies $nf_S$, would be blocked at these frequencies. Frequency response 520 may be shaped as a sync function in some embodiments, though other functions are also possible.

Figure 6A:
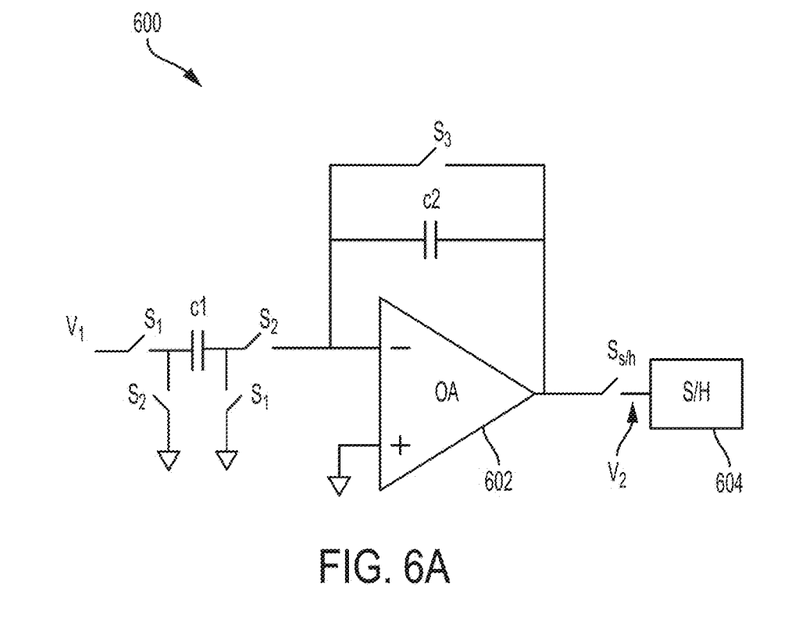
FIG. 6A is a block diagram illustrating an anti-aliasing filter implemented with a finite impulse response filter, in accordance with some embodiments of the technology described herein.

AAF 504 may be implemented in any suitable way, including for example using a finite impulse response (FIR) filter or an infinite impulse response (IIR) filter. An example of an FIR filter that may be used as AAF 504 is illustrated in FIG. 6A, in accordance with some embodiments. FIR filter 600 includes operational amplifier (OA) 602, sample and hold (S/H) circuit 604, switches $S_1$, $S_2$, $S_3$ and $S_{S/H}$, and capacitors $C_1$ and $C_2$. OA 602 may be implemented using any suitable operational amplifier, including for example operational amplifiers having an open-loop voltage-to-voltage gain ($A_V$) that is greater than 0 dB, greater than 10 dB, greater than 20 dB, greater than 30 dB, greater than 40 dB, greater than 50 dB, or greater than any other suitable value. Switches $S_1$, $S_2$, $S_3$ and $S_{S/H}$ may be designed to provide a high-impedance (in the OFF state) or a low-impedance (in the ON state) between their terminals depending on the value of the corresponding drive signals. In one example, the switches are implemented as transistors, though other arrangement are also possible. S/H circuit 604 may be configured to sample (based on switch $S_{S/H}$) the output of OA 602 and hold the sampled value. The input voltage $V_1$ may be equal (or at least derived from) the output signal shown in FIG. 3A. The output voltage $V_2$ may be provided to resistive circuit 502, which is shown in FIG. 5A.

Figure 6B:
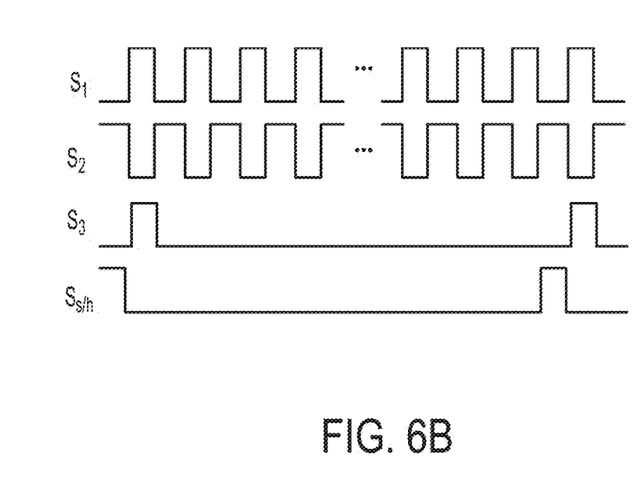
FIG. 6B is a plot illustrating control signals that may be used in connection with the anti-aliasing filter of FIG. 6A, in accordance with some embodiments of the technology described herein.

The timing with which switches $S_1$, $S_2$, $S_3$ and $S_{S/H}$ are controlled, at least in some embodiments, is shown in FIG. 6B. A control circuit (not shown in FIG. 6A) may be used to control the state of the switches. In the plot of FIG. 6B, the control signal $S_1$ controls switches $S_1$, the control signal $S_2$ controls switches $S_2$, the control signal $S_3$ controls switch $S_3$, and the control signal $S_{S/H}$ controls switch $S_{S/H}$. When a control signal is high (i.e., has a high value), the corresponding switch in the ON state; when a control signal is low (i.e., has a low value), the corresponding switch in the OFF state. The opposite logic is may be implemented in other embodiments. Control signals $S_1$ and $S_2$ may vary with periodicities equal to $1/f_S$ in some embodiments. In some embodiments, control signals $S_1$ and $S_2$ have opposite phases (e.g., with a π-phase difference).

When control signal $S_1$ is high, a path may be formed through first switch $S_1$, capacitor $C_1$ and second switch $S_1$. During this period, the voltage $V_{in}$ charges capacitor $C_1$. When control signal $S_2$ is high, a path is created through capacitor $C_1$ and capacitor $C_2$. As a result, at least a portion of the charge of capacitor $C_1$ is transferred to capacitor $C_2$. Control signal $S_{S/H}$ may be high once every M cycles of control signal $S_2$. Following a sampling operation with switch $S_{S/H}$, the charge of capacitor $C_2$ may be reset using switch $S_3$. When controlled as shown in FIG. 6B (or with equivalent control signals), FIR filter 600 may have a frequency response similar to those in FIG. 5B and/or FIG. 5C, where N is equal to M/2.

Figure 7A:
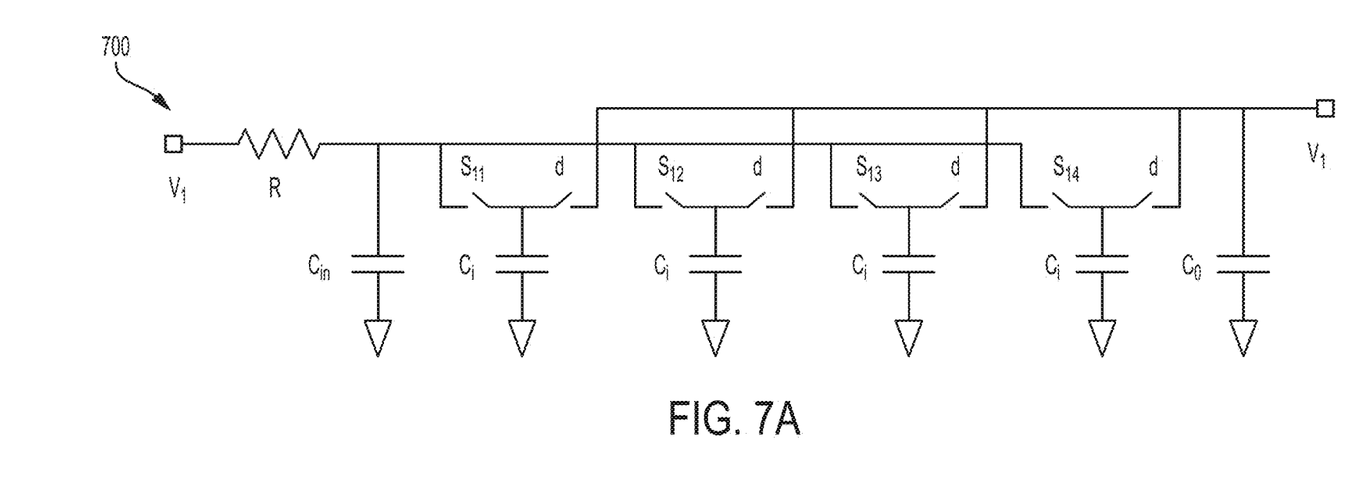
FIG. 7A is a block diagram illustrating an anti-aliasing filter implemented with an infinite impulse response filter, in accordance with some embodiments of the technology described herein.

A possible implementation of AAF 504 using an IIR filter is illustrated in FIG. 7A, in accordance with some embodiments. Unlike the FIR of FIG. 6A, IIR filter 700 is a passive circuit (i.e., does not include operational amplifiers), thus substantially reducing the on-chip space usage. Of course, not all IIR for use in AAF 504 are limited to passive circuits. IIR filter 700 includes resistor R, capacitors $C_{in}$, $C_i$ and $C_o$, and switches $S_{11}$, $S_{12}$, $S_{13}$, $S_{14}$ and d. The capacitances of capacitors $C_i$ may be equal to one another, or may be different (e.g., progressively larger). Each switch S is coupled to a respective capacitor $C_i$. As such, capacitor $C_i$ are referred to as switched capacitors. It should be appreciated that while four switched capacitors are shown in FIG. 7A, IIR filter 700 is not limited to any specific number of switched capacitors.

Figure 7B:
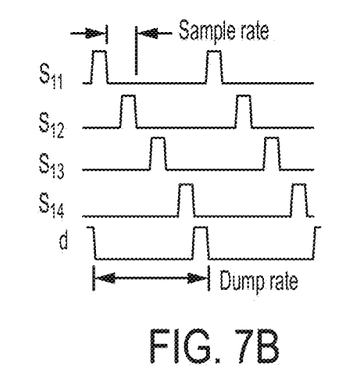
FIG. 7B is a plot illustrating control signals that may be used in connection with the anti-aliasing filter of FIG. 7A, in accordance with some embodiments of the technology described herein.

FIG. 7B is a plot illustrating control signals used for driving the switches of IIR filter 700, in accordance with some embodiments. A control circuit (not shown in FIG. 7A) may be used to control the state of the switches. When control signal $S_{11}$ is high, the capacitor associated with switch $S_1$ is charged; when control signal $S_{12}$ is high, the capacitor associated with switch $S_2$ is charged; etc. As shown in FIG. 7B, the switched capacitors are charged at different times. In one specific example, the control signals are phase shifted relative to one another by $2\pi/M$, where M is the number of switched capacitors. That is, control signal $S_{11}$ is phase shifted relative to control signal $S_{12}$ by $2\pi/M$; control signal $S_{12}$ is phase shifted relative to control signal $S_{13}$ by $2\pi/M$; etc. Once all the switched capacitors (or at least a portion of them) have been charged, the charges are transferred to output capacitor $C_o$ via switches d. The periodicity of the control signals of FIG. 7B may be equal to (or at least derived from) $1/f_S$. When controlled as shown in FIG. 7B (or with equivalent control signals), IIR filter 700 may have a frequency response similar to those in FIG. 5B and/or FIG. 5C.

Figure 8:
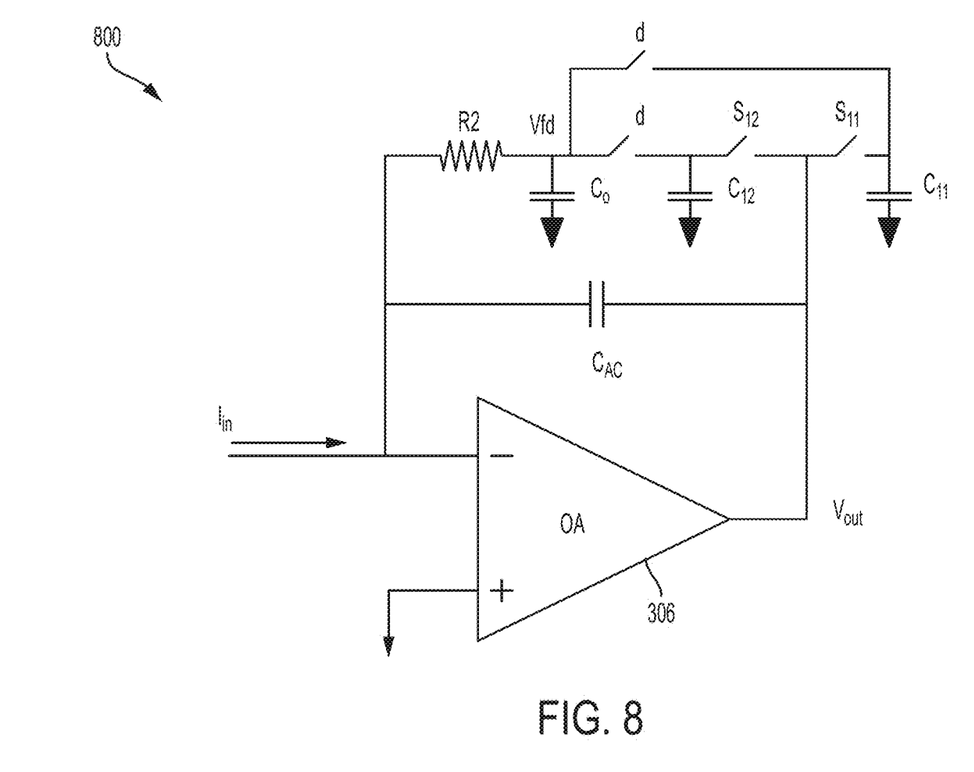
FIG. 8 is a block diagram illustrating a sense amplifier having an anti-aliasing filter, in accordance with some embodiments of the technology described herein.

FIG. 8 is a block diagram illustrating an example of a sense amplifier having an IIR filter serving as an AAF, in accordance with some embodiments. In this example, capacitor $C_{AC}$ serves as AC feedback circuit 308 (see FIG. 3A), resistor $R_2$ serves as resistive circuit 502 (see FIG. 5A), and capacitors $C_{11}$, $C_{12}$, $C_o$ and switches $S_{11}$, $S_{12}$ and d collectively serve as AAF 504. Resistor $R_2$ may be implemented as an actual resistor, or as an active load. Capacitors $C_{11}$, $C_{12}$, $C_o$ and switches $S_{11}$, $S_{12}$ and d may collectively operate as described in connection with FIGS. 7A-7B, with M=2 (though any other suitable number M of switched capacitors may be used). As described above, switched capacitors $S_{11}$ and $S_{12}$ may be charged with a phase difference of it, and switches d may be used to transfer the charges to capacitor $C_o$. In this way, the AC components of the charges in the capacitors $C_{11}$ and $C_{12}$ are combined out-of-phase, thus suppressing the AC components provided to $R_2$ at integer multiples of $f_S$. In addition, the DC components of the charges in the capacitors $C_{11}$ and $C_{12}$ are combined in-phase, thus allowing the DC component to be transferred to $R_2$.

Figure 9:
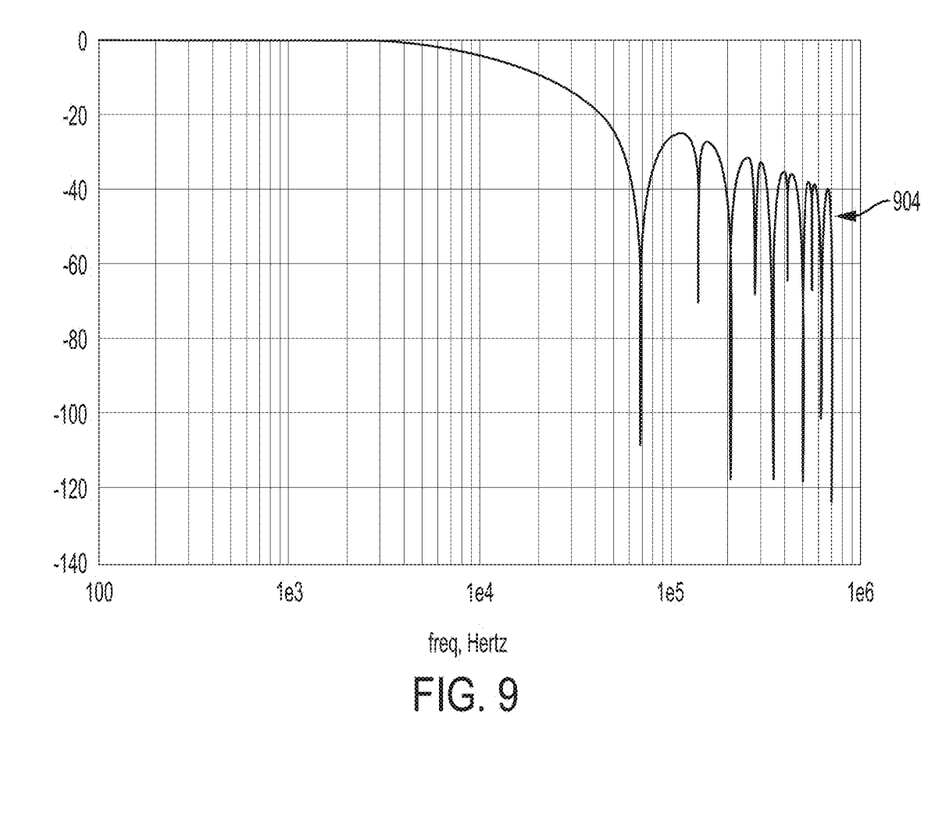
FIG. 9 is a plot illustrating the frequency response of the sense amplifier of FIG. 8, in accordance with some embodiments of the technology described herein.

FIG. 9 is a plot illustrating an example of a spectrum (904) of the output of an AAF of the types described herein (e.g., signal $V_{fd}$ of FIG. 8). In this specific example, $f_S$=70 KHz. As illustrated, the output of the AAF exhibits dips at $f_S$ and integer multiples thereof. In this way, only the low frequency portion of the spectrum, including the DC component, is transferred to the resistive circuit (e.g., resistor $R_2$), thus providing a DC discharge path.

IV. Conclusion

Aspects of the technology described herein may provide one or more benefits, some of which have been previously described. Now described are some non-limiting examples of such benefits. It should be appreciated that not all aspects and embodiments necessarily provide all of the benefits now described. Further, it should be appreciated that aspects of the technology described herein may provide additional benefits to those now described.

Aspects of the technology described herein provide a sense amplifier for use in connection with MEMS gyroscopes that provide a DC discharge path without hindering the circuit's ability to accurately detect angular velocity. In fact, unlike previous implementations, the sense amplifiers described herein provide DC discharge paths while limiting thermal noise, on-chip space usage, and while also rejecting non-linearities in the DC discharge path.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

What is claimed is:

1. A microelectromechanical systems (MEMS) apparatus comprising:
    a gyroscope; and
    an amplifier comprising:
        an operational amplifier having an input terminal coupled to the MEMS gyroscope and an output terminal; and
        a feedback circuit coupled between the input terminal and the output terminal of the operational amplifier, the feedback circuit comprising an anti-aliasing filter and a resistive circuit in series with the anti-aliasing filter, wherein the anti-aliasing filter is directly coupled to the output terminal of the operational amplifier.

2. The MEMS apparatus of claim 1, wherein the anti-aliasing filter comprises one or more switched capacitors.

3. The MEMS apparatus of claim 1, wherein the anti-aliasing filter is configured to attenuate signals oscillating at a resonant frequency of the MEMS gyroscope.

4. The MEMS apparatus of claim 1, wherein the input terminal of the operational amplifier is directly coupled to the MEMS gyroscope.

5. The MEMS apparatus of claim 1, wherein the amplifier further comprises a reactive circuit coupled in parallel with the feedback circuit, wherein the reactive circuit exhibits a high-pass frequency response.

6. The MEMS apparatus of claim 1, wherein the resistive circuit comprises an active load.

7. A method for sensing angular motion using a microelectromechanical systems (MEMS) gyroscope, the method comprising:
    in response to angular motion of the MEMS gyroscope, generating a gyroscope signal representative of a rate of the angular motion, wherein the MEMS gyroscope has a resonant frequency;
    providing the gyroscope signal to an input terminal of an operational amplifier;
    generating an output signal based on the gyroscope signal at an output terminal of the operational amplifier; and
    providing a portion of the output signal to the input terminal of the operational amplifier by using a feedback circuit coupled between the input terminal of the operational amplifier and the output terminal of the operational amplifier, wherein the feedback circuit comprises an anti-aliasing filter and a resistive circuit in series with the anti-aliasing filter, wherein the anti-aliasing filter is directly coupled to the output terminal of the operational amplifier, wherein the providing the portion of the output signal to the input terminal of the operational amplifier comprises:
        providing a direct current (DC) component of the output signal to the input terminal of the operational amplifier by using the resistive circuit; and
        attenuating the output signal at the resonant frequency by using the anti-aliasing filter.

8. The method of claim 7, wherein the providing the portion of the output signal to the input terminal of the operational amplifier further comprises:
    filtering the output signal at one or more integer multiples of the resonant frequency by using the anti-aliasing filter.

9. The method of claim 8, wherein the filtering the output signal at one or more integer multiples of the resonant frequency comprises charging a plurality of switched capacitors out-of-phase relative to one another.

10. The method of claim 9, wherein the charging the plurality of switched capacitors out-of-phase relative to one another comprises charging the plurality of switched capacitors with phase differences given by $2n/M$, where M is a number of capacitors in the plurality of switched capacitors.

11. The method of claim 9, wherein the filtering the output signal at one or more integer multiples of the resonant frequency further comprises charging the plurality of switched capacitors with a rate substantially equal to the resonant frequency.

12. The method of claim 7, further comprising: determining the angular motion by using the output signal.

13. The method of claim 7, wherein the providing the DC component of the output signal to the input terminal of the operational amplifier comprises providing the DC component of the output signal directly to the input terminal of the operational amplifier.

14. A circuit for use with a microelectromechanical systems (MEMS) gyroscope, comprising:
    an operational amplifier having an input terminal configured to be coupled to the MEMS gyroscope and an output terminal;
    a first feedback circuit coupled between the input terminal and the output terminal of the operational amplifier, the first feedback circuit comprising an anti-aliasing filter and a resistive circuit in series with the anti-aliasing filter, wherein the anti-aliasing filter is directly coupled to the noutput terminal of the operational amplifier; and
    a second feedback circuit coupled in parallel to the first feedback circuit, the second feedback circuit exhibiting a high-pass frequency response.

15. The circuit of claim 14, wherein the input terminal of the operational amplifier is configured to be directly coupled to the MEMS gyroscope.

16. The circuit of claim 14, wherein the anti-aliasing filter comprises a comb filter.

17. The circuit of claim 14, wherein the second feedback circuit comprises a reactive circuit.

18. The circuit of claim 14, further comprising the MEMS gyroscope.

19. The circuit of claim 16, wherein the comb filter comprises a plurality of switched capacitors.

20. The circuit of claim 19, wherein the comb filter is configured to attenuate signals oscillating at a resonant frequency of the MEMS gyroscope.

* * * * *

UNITED STATES PATENT AND TRADEMARK OFFICE
CERTIFICATE OF CORRECTION

PATENT NO. : 10,914,583 B2
APPLICATION NO. : 15/900622
DATED : February 9, 2021
INVENTOR(S) : Jiefeng Yan et al.

Page 1 of 1

It is certified that error appears in the above-identified patent and that said Letters Patent is hereby corrected as shown below:

In the Claims

Claim 1, Column 11, Line 24:
a gyroscope; and
Should read:
a MEMS gyroscope; and Claim 10, Column 12, Line 24:
tors with phase differences given by 2n/M, where M is a
Should read:
tors with phase differences given by $2\pi/M$, where M is a Claim 14, Column 12, Line 48:
to the noutput terminal of the operational amplifier; and
Should read:
to the output terminal of the operational amplifier; and Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*